(12) United States Patent
Khrushchev et al.

(10) Patent No.: US 10,480,724 B2
(45) Date of Patent: Nov. 19, 2019

(54) LIGHTING DEVICE HAVING A PUMPING LIGHT UNIT AND LUMINESCENT ELEMENT

(71) Applicant: OSRAM GmbH, Munich (DE)

(72) Inventors: Sergey Khrushchev, Regensburg (DE); Andreas Breidenassel, Bad Abbach (DE)

(73) Assignee: OSRAM GmbH, Munich (DE)

( * ) Notice: Subject to any disclaimer, the term of this patent is extended or adjusted under 35 U.S.C. 154(b) by 180 days.

(21) Appl. No.: 15/527,727

(22) PCT Filed: Nov. 5, 2015

(86) PCT No.: PCT/EP2015/075768
§ 371 (c)(1),
(2) Date: May 18, 2017

(87) PCT Pub. No.: WO2016/078920
PCT Pub. Date: May 26, 2016

(65) Prior Publication Data
US 2017/0350562 A1  Dec. 7, 2017

(30) Foreign Application Priority Data

Nov. 18, 2014 (DE) .................. 10 2014 223 510

(51) Int. Cl.
*F21K 9/64* (2016.01)
*G03B 21/20* (2006.01)
(Continued)

(52) U.S. Cl.
CPC ............. *F21K 9/64* (2016.08); *F21K 9/68* (2016.08); *F21V 5/04* (2013.01); *F21V 7/0066* (2013.01);
(Continued)

(58) Field of Classification Search
CPC ..... F21K 9/64; F21K 9/68; F21V 5/04; F21V 7/0066; F21V 9/30; F21V 13/14;
(Continued)

(56) References Cited

U.S. PATENT DOCUMENTS

2007/0109784 A1  5/2007  Kosnik et al.
2012/0316397 A1  12/2012 Berben et al.
(Continued)

FOREIGN PATENT DOCUMENTS

CN    103221735 A    7/2013
CN    104141924 A   11/2014
(Continued)

OTHER PUBLICATIONS

International Search Report based on application No. PCT/EP2015/075768 (5 pages + 2 pages English translation) dated Jan. 25, 2016 (for reference purpose only).

(Continued)

*Primary Examiner* — Anh T Mai
*Assistant Examiner* — Nathaniel J Lee (57) ABSTRACT

A lighting device provides a pump light unit for emitting pump light, a phosphor element for generating conversion light in response to excitation by the pump light, and a wavelength-dependent beam splitter which is reflective to the pump light and transmissive to the conversion light. The first pump light portion is incident on a light incidence surface of the beam splitter and is reflected from the beam splitter to the phosphor element. The element emits the conversion light in response to the excitation by the pump light. The conversion light is likewise incident on the light incidence surface, but transmitted by the beam splitter and exiting at a light exit surface of the beam splitter opposite the light incidence surface. Concurrently, the second pump light portion, reflected from the beam splitter, is directed onto the (Continued)

light exit surface of the beam splitter and is superposed with the conversion light.

18 Claims, 5 Drawing Sheets

(51) Int. Cl.
| | |
|---|---|
| H01S 5/00 | (2006.01) |
| F21K 9/68 | (2016.01) |
| F21V 9/30 | (2018.01) |
| F21V 5/04 | (2006.01) |
| F21V 7/00 | (2006.01) |
| F21V 7/04 | (2006.01) |
| F21V 13/14 | (2006.01) |
| G02B 27/14 | (2006.01) |
| H01S 5/40 | (2006.01) |
| F21Y 115/30 | (2016.01) |

(52) U.S. Cl.
CPC .............. *F21V 7/04* (2013.01); *F21V 9/30* (2018.02); *F21V 13/14* (2013.01); *G02B 27/141* (2013.01); *G02B 27/142* (2013.01); *G03B 21/204* (2013.01); *H01S 5/005* (2013.01); *F21Y 2115/30* (2016.08); *H01S 5/0071* (2013.01); *H01S 5/4025* (2013.01)

(58) Field of Classification Search
CPC ....... F21V 7/04; G02B 27/141; G02B 27/142; G03B 21/204; H01S 5/005
See application file for complete search history.

(56) References Cited

U.S. PATENT DOCUMENTS

| | | | |
|---|---|---|---|
| 2013/0050654 | A1 | 2/2013 | Hu et al. |
| 2014/0254129 | A1* | 9/2014 | Miyoshi .................. F21V 13/08 362/84 |
| 2014/0333901 | A1 | 11/2014 | Hartwig et al. |
| 2014/0355240 | A1 | 12/2014 | Farchtchian |
| 2015/0167907 | A1 | 6/2015 | Hoehmann |
| 2015/0222864 | A1* | 8/2015 | Inoko ........................ F21V 9/14 353/31 |

FOREIGN PATENT DOCUMENTS

| | | |
|---|---|---|
| DE | 10 2010 001 942 A1 | 8/2011 |
| DE | 10 2010 001 945 A1 | 8/2011 |
| DE | 10 2011 088 791 B3 | 4/2013 |
| DE | 10 2012 211 837 A1 | 1/2014 |
| EP | 2642178 A1 | 9/2013 |
| WO | 2009 112 961 A1 | 9/2009 |
| WO | 2012 109 168 A1 | 8/2012 |

OTHER PUBLICATIONS

German Search Report based on application No. 10 2014 223 510.3 (8 pages) dated Jul. 1, 2015 (for reference purpose only).
Chinese Office Action including search report issued for parallel Chinese patent application 201580062769, dated Aug. 30, 2018 (6 pages and 6 pages translation).

* cited by examiner

LIGHTING DEVICE HAVING A PUMPING LIGHT UNIT AND LUMINESCENT ELEMENT

RELATED APPLICATIONS

The present application is a national stage entry according to 35 U.S.C. § 371 of PCT application No.: PCT/EP2015/075768 filed on Nov. 5, 2015, which claims priority from German application No.: 10 2014 223 510.3 filed on Nov. 18, 2014, and is incorporated herein by reference in its entirety.

TECHNICAL FIELD

The present disclosure relates to a lighting device having a pump light unit for the emission of pump light, and a phosphor element for the at least partial conversion of the pump light into conversion light.

BACKGROUND

Although gas-discharge lamps are currently most widely used as high-luminance light sources, more recent developments are directed toward combining a pump light unit having a high power density, such as a laser, with a phosphor element which is arranged at a distance from it. In response to excitation by the pump light, the phosphor element emits conversion light, which may then be used for lighting purposes. The technical problem underlying the present disclosure is to provide an advantageous lighting device having a pump light unit and a phosphor element.

SUMMARY

According to the present disclosure, this object is achieved via a lighting device having a pump light unit for the emission of pump light, a phosphor element for the generation of conversion light in response to excitation by the pump light, and a wavelength-dependent beam splitter which is reflective to the pump light and transmissive to the conversion light, wherein a first portion of the pump light is incident on a light incidence surface of the beam splitter and is reflected from the beam splitter to the phosphor element, said phosphor element emitting the conversion light in response to the excitation by the pump light, said conversion light also being incident on the light incidence surface of the beam splitter, but being transmitted by the beam splitter and exiting at a light exit surface of the beam splitter opposite the light incidence surface, and wherein at the same point in time, a second portion of the pump light is directed onto the light exit surface of the beam splitter and is reflected by the beam splitter, and is superposed with the conversion light transmitted by the beam splitter, so that downstream of the beam splitter, mixed light made up of the pump light and the conversion light is available for lighting purposes.

Preferred embodiments are found in the dependent claims and in the overall disclosure, wherein in the depiction, a distinction is not always made in particular between device and application aspects; in any case, the disclosure is also to be read implicitly with respect to the latter.

By means of the lighting device, mixed light made up of pump light and conversion light may be generated. The mixture or superposition takes place by means of the wavelength-dependent beam splitter, which is reflective to the pump light but is transmissive to the conversion light. In this respect, "reflective"/"transmissive" means that, for example, at least 60%, 70%, or 80% (with increasing preference in the order as stated) of the respective light, i.e., the pump light or the conversion light, as the case may be, which is incident on a wavelength-dependent reflection layer of the beam splitter, is reflected/transmitted.

The first pump light portion, which is incident on the light incidence surface of the beam splitter, is reflected by it to the phosphor element. Likewise, the second pump light portion is also reflected by the beam splitter. However, since the first and the second pump light portion are incident on opposite sides of the beam splitter, the first and the second pump light portion are reflected in opposite directions, advantageously exactly opposite directions. The first pump light portion is reflected to the phosphor element; however, the second pump light portion is reflected away from it. The conversion light generated by the phosphor element in response to the excitement by the pump light also propagates away from it, i.e., it then has the same path as the second pump light portion, downstream of the beam splitter.

Due to the fact that the pump light is incident on opposite sides of the beam splitter at the same point in time, one portion of it may be used for phosphor excitement, and the other portion may be blended with the accordingly generated conversion light.

The beam splitter is advantageously an interference mirror (also referred to as a "dichroic mirror"), which has a wavelength-dependent reflection layer which is constructed as a multilayer system. This reflective layer may, for example, be constructed from two dielectric layer materials which differ in their index of refraction and are arranged consecutively in layers in an alternating manner in the reflection layer. In addition to the reflection layer, the beam splitter may also have a base body, advantageously a transparent plate. The light incidence surface (of the beam splitter) may then, for example, be one side of the base body, and the light exit surface may be formed from the side of the reflection layer facing away from the base body, or vice-versa. A reflection layer enclosed between two base bodies is also possible. As an integrally formed part, the beam splitter may, for example, also have two wavelength-dependent reflection layers, which are arranged approximately on opposite sides of a base body. Advantageously, the first and the second pump light portion are incident on the same wavelength-dependent reflection layer of the beam splitter, only onto opposite sides of it.

The conversion light advantageously has a longer wavelength than the pump light (down-conversion); the pump light may, for example, be blue light, for example, having a dominant wavelength of 405 nm or 450 nm; the conversion light is advantageously yellow light, the dominant wavelength of which may be, for example, a minimum of 570 nm, advantageously a minimum of 575 nm, and, for example, a maximum of 585 nm, advantageously a maximum of 580 nm. A garnet phosphor, for example, cerium-doped yttrium-aluminum garnet (YAG), may be preferred as a yellow phosphor.

For homogenizing the mixed light made up of pump light and conversion light, for example, a light mixing means may also be arranged downstream of the splitter, for example, a diffusion disk, a non-imaging integrator, or a microlens array.

In the case of the lighting device according to the present disclosure, the perception of the light mixture is not dependent on time averaging, because the second pump light portion and the conversion light are simultaneously present at an output of the lighting device. The first pump light portion is directed to the phosphor element, which thus emits conversion light which passes through the beam splitter, and the second pump light portion is admixed simultaneously (at the same point in time) with the conversion light via the light exit surface of the beam splitter, for instance, over a period of at least 1 ms, 10 ms, 100 ms, 1 s, 100 s, or continuously during operation. In contrast to a mixture which only results on average over time, this may provide advantages insofar as, for example, no moving parts must be provided which generate a sequential series, such as a color/filter wheel. This may, for example, simplify the structure and thus also provide cost advantages, particularly as, in the case of moving parts, the robustness may be lower, the noise generation may be higher, and the maintenance complexity may be increased.

In a preferred embodiment, the second pump light portion and the conversion light have primary propagation directions which are essentially parallel to one another, directly downstream of the beam splitter; they should, with increasing preference in this sequence, be at an angle of not more than 10°, 8°, 6°, 4°, or 2° with respect to one other. The "primary propagation direction" is ascertained in each case as a centroid direction of the respective beam, namely, as the centroid direction of the direction vectors weighted by a respective luminous flux. A hereinafter referenced angle of incidence or angle of emergence is then obtained as the angle between the primary direction of propagation of the incident or emergent beam and a perpendicular onto the corresponding incidence or exit surface.

The wavelength-dependent reflection layer of the beam splitter is advantageously flat, i.e., it has a flat entrance surface (which may be equal to the light incidence surface of the beam splitter), a flat exit surface (which may be equal to the light exit surface of the beam splitter), and a thickness which is perpendicular to it, taken in the direction of thickness, said thickness being constant across the layer.

The conversion light then, for example, has an angle of incidence with respect to the advantageously flat entrance surface of the reflection layer of at least 40°, advantageously at least 43°, and, for instance, at most 50°, advantageously at most 47°, wherein 45° is particularly preferable within the scope of what is technically feasible. The second pump light portion has, for example, an angle of incidence of at least 40°, advantageously at least 43°, and, for instance, at most 50°, advantageously at most 47° (45° is particularly preferable) with respect to the exit surface, which is also advantageously flat and which is opposite the entrance surface of the reflection layer. The direction of incidence of the conversion light and that of the second pump light portion (directly upstream of the beam splitter in each case) form an angle of at least 85°, advantageously at least 88°, and, for example, at most 95°, advantageously at most 92°.

The first pump light portion is advantageously incident on the reflection layer of the beam splitter at an angle of incidence of at least 40°, more advantageously at least 43°, and, for example, at most 50°, advantageously at most 47° (45° is particularly preferable). A primary direction of propagation of the first pump light portion directly upstream of the beam splitter is advantageously opposite to a primary direction of propagation of the second pump light portion directly upstream of the beam splitter; the two thus form an angle of at least 175°, advantageously at least 178°, and at most 185°, advantageously at most 182°; particularly advantageously, they are exactly opposite (180°).

In a preferred embodiment, a reflector is arranged, with reference to the second pump light portion, upstream of the light exit surface of the beam splitter, the second pump light portion thus being incident on said light exit surface. This reflector is provided in the beam path containing the second pump light portion in such a way that said reflector reflects this second pump light portion onto the light exit surface of the beam splitter. A corresponding reflection surface of the reflector is advantageously provided as complete mirroring, for example, as a metal film. Between the reflector and the beam splitter, the second pump light portion advantageously passes through a volume of gas, particularly advantageously air. Advantageously, a beam guidance is such that the two primary directions of propagation, which the second pump light portion has directly upstream of and directly downstream of the reflector, are exactly opposite one another.

Although such an arrangement having a reflector is preferable, the second pump light portion could generally, for example, also be directed by means of a glass fiber to the light exit surface of the beam splitter. The second pump light portion, which, however, is advantageously directed via a reflector to the light exit surface of the beam splitter, may then be directed either through the beam splitter (through an interruption region) or directed past it. The first "interruption region" variant will initially be described below.

In a preferred embodiment, a wavelength-dependent reflection layer of the beam splitter is thus interrupted in an interruption region, through which the second pump light portion passes and thus travels past the reflection layer. In the interruption region, for example, only the reflection layer may be interrupted, and, for instance, a (transparent) base body of the beam splitter may be continuously formed; however, the beam splitter may also be entirely interrupted, i.e., for example, provided with a through-hole. Generally, the second pump light portion then results as the portion of the pump light penetrating through the interruption region.

According to a preferred embodiment, the interruption region is provided as a pinhole in the reflection layer; the reflection layer thus encloses the interruption region completely (with reference to the layer directions), and there is no reflection layer within this enclosure. The interruption region is particularly advantageously a circular pinhole which, for example, may be arranged in the center. In general, multiple interruption regions may also be provided, i.e., in particular multiple pinholes next to one another, which may have the same diameter or a different diameter. For example, a ring-shaped, in particular a circular ring-shaped, interruption region may be provided, wherein, for instance, multiple rings, for example, concentrically arranged rings having a different diameter, may also be nested within one other.

In preferred embodiments, an interruption region provided as a pinhole may be arranged non-centrally, i.e., offset from a surface centroid of the surface which the pump light illuminates on the entrance surface of the beam splitter. This may be of interest, for instance, with respect to an adjustable light mixture which is described below.

In a preferred embodiment, the interruption region is to be small in relation to the utilized reflection layer. Thus, an interruption region surface content taken in the layer directions of the reflection layer is to be at a ratio of at most 1/5, with increasing preference in this sequence, at most 1/20, 1/50, 1/100, 1/150, 1/200, 1/250, 1/300, 1/350, 1/400, 1/450, or 1/500, with respect to the reflection layer surface content taken in the same directions. Possible lower limits may be, for example, with increasing preference in this sequence, at least 1/10,000, 1/8,000, 1/6,000, 1/4,000, 1/2,000, 1/1,500, 1/1,250, or 1/1,000 (upper and lower limits may also be of interest, independently of each other).

In this case, only a region of the reflection layer "contributing to the light shaping", on which at least pump light or conversion light is thus incident (or both), is taken as a basis for the reflection layer surface content. This region may extend over the entire reflection layer in the case of full illumination; otherwise, non-illuminated regions are not taken into consideration.

In a preferred embodiment, a scattering means, advantageously a diffuse scattering means, is arranged in the beam path of the second pump light portion, downstream of the interruption region and upstream of the light exit surface of the beam splitter. Downstream of the interruption region, the second pump light portion is thus then incident on this scattering means and is expanded by it, for example, by at least 5°, 10°, 15°, 20°, or 25° (with increasing preference in the order as stated). In simplified terms, a comparatively "narrow" beam thus passes through the interruption region, and it is expanded in order then to be incident over a comparatively large region on the light exit surface of the beam splitter (and to pass through the interruption region once again only to a small extent).

Possible upper limits of the expansion of the aperture angle may be, for example, at most 160°, 140°, or 120°. Should the pump beam be expanded differently in the axes parallel to a primary direction of propagation, an average value is considered. The "aperture angle" is taken between the lateral surfaces of the beam; the lateral surface is to lie where the beam power has decreased to half the maximum (full width at half maximum).

In a preferred embodiment, the reflector and the scattering means are an integrated part, i.e., a diffuse reflector is provided. The reflection surface of the reflector, which, for instance, as mentioned above, forms a metal film, is then, for example, matt, i.e., roughened. A beam containing the second pump light portion is simultaneously reflected and expanded at the diffuse reflector.

The aforementioned "second pump light portion travels laterally past the reflection layer of the beam splitter" variant will be explained in greater detail below.

In a preferred embodiment, the second pump light portion is thus directed laterally past the wavelength-dependent reflection layer of the beam splitter, said reflection layer reflecting the first pump light portion. For instance, in the case of a flat reflection layer having an entrance surface and an exit surface lying in a plane in each case (which are parallel to one other and are spaced corresponding to the layer thickness), the second pump light portion then passes through these two planes, namely, next to the wavelength-dependent reflection layer.

In a preferred embodiment, a reflection surface of the reflector, said reflector being in the beam path containing the second pump light portion and being upstream of the light exit surface of the beam splitter, has a convex shape, and this convex reflection surface bundles the second pump light portion. This reflection surface, which is advantageously provided as complete mirroring and, for example, is formed from a metal film (see above), may, for example, have an ellipsoidal shape, wherein a paraboloidal shape is preferable. Thus, a beam which is expanded the purpose of traveling laterally past the reflection layer, and which to some extent encloses the wavelength-dependent reflection layer, may then again be combined.

A scattering means, for instance, a diffuse diffusion disk, may be arranged in the beam path containing the second pump light portion (downstream of the convex reflection surface), upstream of the light exit surface of the beam splitter, said scattering means expanding the beam containing the second pump light portion. Such a scattering means may, for example, also cause certain losses due to backscattering (back to the convex reflection surface, which would then collimate the light reflected back). To increase the efficiency, an additional mirror may therefore be preferable, on which backscattered light is incident and from which it is reflected to the scattering means (and thus ultimately to the beam splitter).

Such an additional mirror may, for example, be provided with complete mirroring, for instance, with a spherical reflection surface. The mirror could be provided with holes for the beam path containing the second pump light portion, or the latter may also travel past it laterally.

Generally, i.e., also in the case of the "interruption region" variant, a beam compression optical system, for instance, a staircase mirror or advantageously a telescopic optical system, may be arranged in a beam path containing the pump light (or a portion thereof), upstream of the light entrance surface of the beam splitter. The beam compression optical system reduces the beam cross section, for example, by at least 20%, 40%, or 50%. In the case of the "interruption region" variant, the total pump light, i.e., including the second pump light portion, may pass through the beam compression optical system.

In a preferred embodiment, which relates to the "second pump light portion travels laterally past the reflection layer" variant, the first pump light portion is directed through the beam compression optical system, but the second pump light portion travels past it, i.e., a beam path containing the second pump light portion does not pass through the beam compression optical system.

In a preferred embodiment, a converging lens is arranged in the beam path containing the first pump light portion, upstream of the pump light unit and downstream of the light incidence surface of the beam splitter. Advantageously, in this case, it is the entry lens of a telescopic optical system. The converging lens is enclosed by a plane-parallel plate, wherein the direction of thickness of the plate and an optical axis of the converging lens are advantageously parallel to one another. The lens and the plane-parallel plate are advantageously at least one piece, i.e., it is not possible to separate them without damage; more advantageously, they are provided as a monolithic part; thus, they are free from material boundaries in the interior.

A converging lens which is downstream of the pump light unit and upstream of the light incidence surface beam splitter may also be cut; thus, for example, when viewed along the optical axis of the lens, a lateral edge of the lens may be offset toward the optical axis (in comparison to the opposite lateral edge); the second pump light portion then does not travel through the lens, but travels past it due to the receding lateral edge. Thus, for instance, in the case of a pump light unit having pump light sources arranged in rows/lines, an entire row/line may also be excluded (from the first pump light portion).

The pump light unit, the plate having the converging lens, and the remaining lighting device are then arranged with respect to one other in such a way that the first pump light portion passes through the converging lens and thus advantageously a telescopic optical system; however, the second pump light portion does not pass through the converging lens, but rather passes through the plane-parallel plate, and is therefore not bundled, in any case, not at this point.

The concepts "second pump light portion travels laterally past a wavelength-dependent reflection layer" and "interruption region" may be alternatives or may be combined, wherein in the latter case, an "inner" second pump light portion is directed through the interruption region, and an "outer" second pump light portion travels laterally past the reflection layer.

In a preferred embodiment, the pump light unit is constructed from a plurality of pump light sources. Advantageously, a laser source, particularly advantageously a laser diode, is provided as a pump light source. Thus, the pump light unit is then, for example, an array made up of a plurality of laser diodes, for example made up of at least two, three, or four laser diodes; possible upper limits may be, for example, at most 1,000, 500, 100, 50, or 30 laser diodes. The laser diodes may generally also have a different frequency (dominant wavelength); for example, the laser diodes which form the first pump light portion may have a first frequency, and the laser diodes forming the second pump light portion may have a second frequency which is different from the first frequency. Advantageously, the laser diodes of the pump light unit have the same frequency; particularly advantageously, they are structurally identical. The laser diodes may, for example, also be operated differently (constantly or cyclically); however, they are advantageously operated in the same way.

The pump light unit is advantageously arranged relative to the beam splitter in such a way that it lies entirely on one side of the beam splitter, namely, on the side which faces the light incidence surface of the beam splitter. If this light incidence surface is, for example, flat, the pump light unit is then to lie entirely on one side of a plane containing the light incidence surface, wherein, for example, the wavelength-dependent reflection layer of the beam splitter lies on the other side of this plane. Generally, the combination of multiple pump light sources into a pump light unit, for example, with respect to a compact structure, may be of interest and may provide handling advantages during fabrication. The plurality of pump light sources of the pump light unit is advantageously housed together (multi-die package).

In a preferred embodiment which relates to a pump light unit constructed from a plurality of pump light sources, at least two of the pump light sources contribute different amounts to the first and the second pump light portion; thus, they differ in their respective ratio of the contribution to the first pump light portion with respect to the contribution to the second pump light portion. These at least two pump light sources are then controllable independently of one another in such a way that the ratio of the first pump light portion to the second pump light portion is entirely adjustable, in any case, partially adjustable. It does not necessarily have to be possible to completely switch off one of the pump light portions during operation, but rather, a change in the mixed light is allowed according to a ratio which is changed within certain limits. The latter is thus adjustable to a certain extent, namely, via a control of the pump light sources, i.e., via a change in the average output power, for example, via a change in the operating mode (constant operation or cyclical operation) of the pump light sources, and thus advantageously purely electronically.

Advantageously, the adjustability allows a change in the ratio of the first pump light portion to the second pump light portion by at least 10%, more advantageously at least 20% or 30%. For example, if a single pump light sources provides only the second pump light portion, this portion may be completely switched off.

In a preferred embodiment, the mixed light is white light, the color temperature of which is adjustable, namely, by changing the ratio of the first pump light portion to the second pump light portion.

The lighting device according to the present disclosure may advantageously be used for illumination via a mixture made up of the conversion light and the second pump light portion. Generally, said lighting device may, for example, be used as a light source of a projection device; particularly preferable application areas may include operating field or endoscopic lighting. The lighting device advantageously makes illumination over a large region possible, for instance, in the automobile lighting sector, in particular road illumination using a front headlight. Furthermore, for example, stage lighting or scene lighting in the film and television sectors may be of interest. The lighting device may also be used as a light source for an effect lighting device.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which.

DETAILED DESCRIPTION

Figure 1:
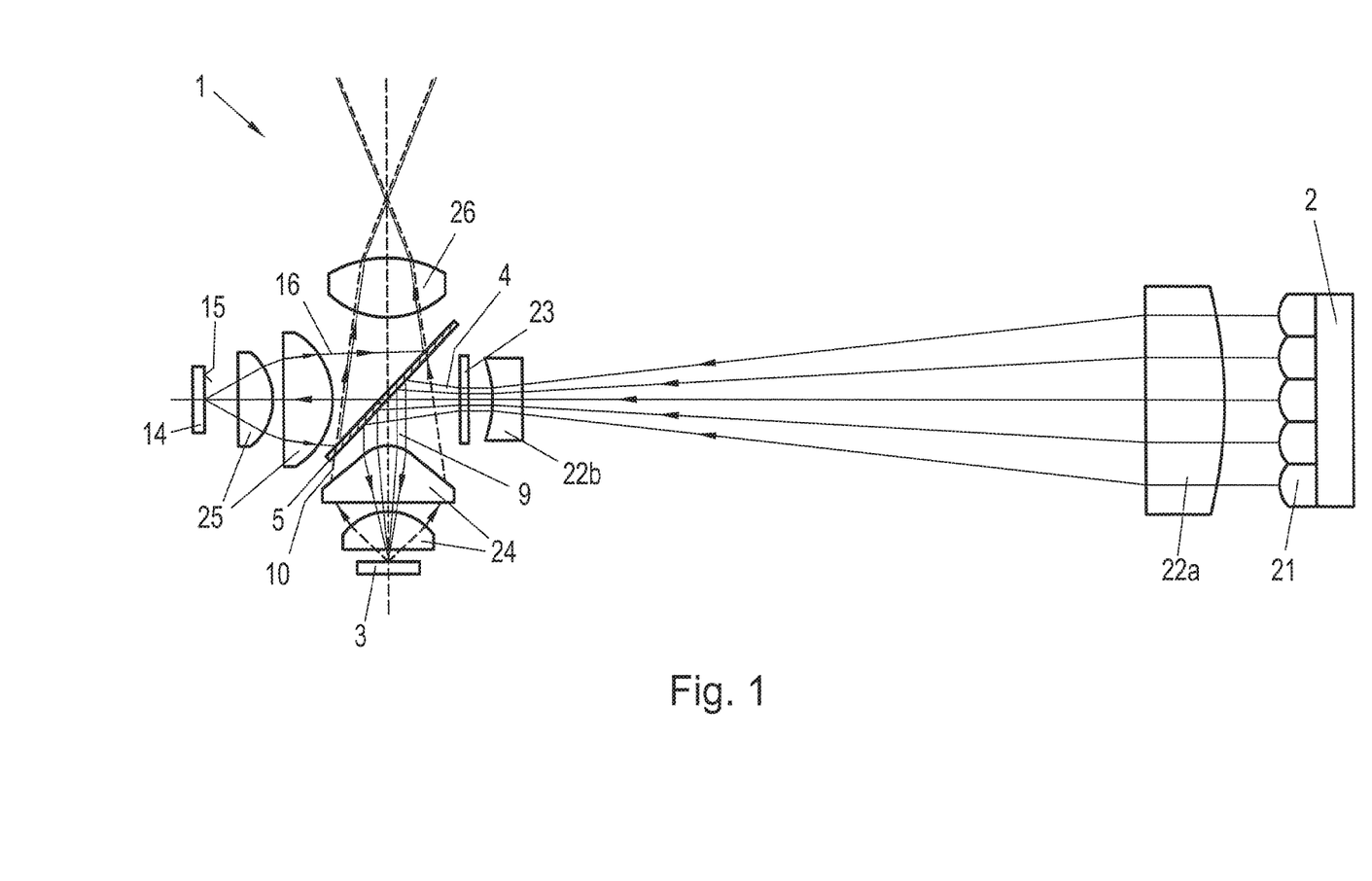
FIG. 1 shows a side view of a first lighting device according to the present disclosure having a pump light unit, a phosphor element, and a beam splitter.

FIG. 1 shows a lighting device 1 having a pump light unit 2, in particular an array made up of 25 laser diodes (not shown individually), which are housed together. For the conversion of pump light (λ=450 nm) emitted by the pump light unit 2, a phosphor element 3 (YAG:Ce) is provided which emits yellow conversion light in response to the excitation by the pump light.

Figure 2:
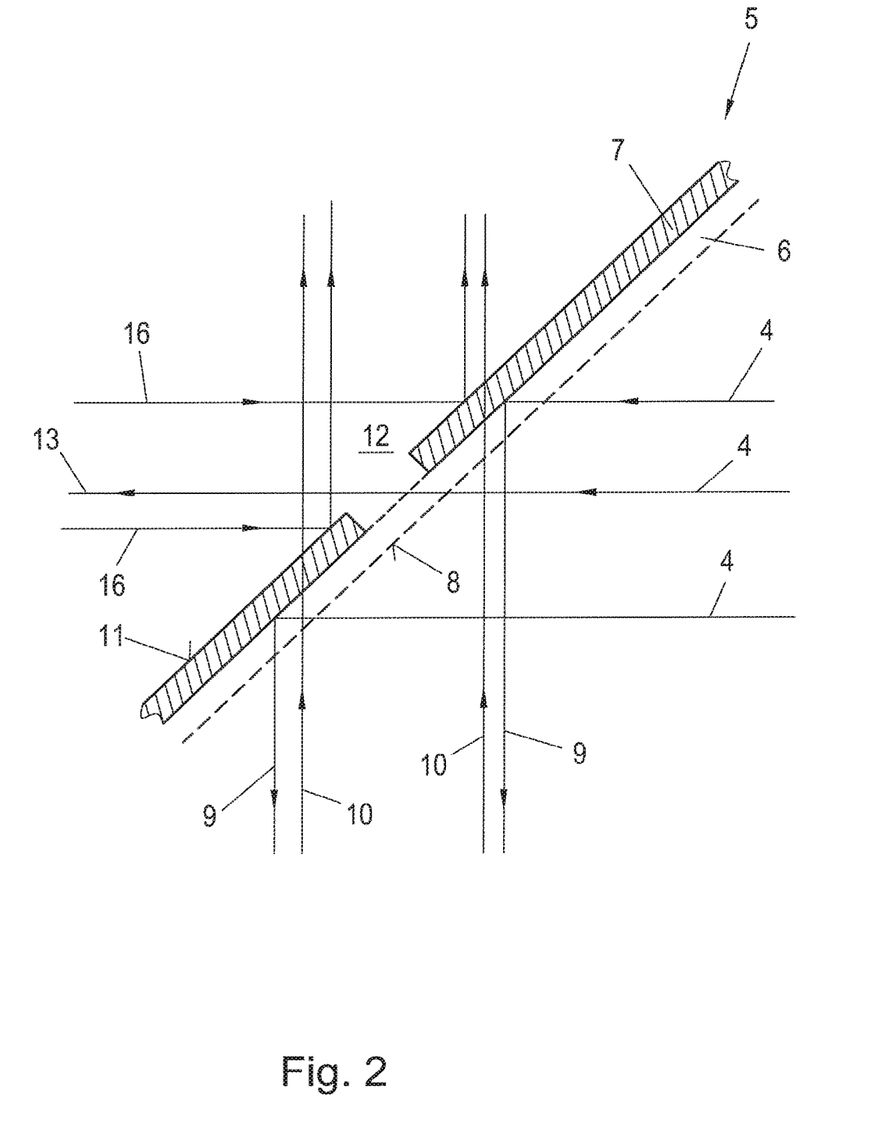
FIG. 2 shows a detailed view of the lighting device according to FIG. 1.

Upstream of the phosphor element 3 with respect to the pump light propagation, a wavelength-dependent beam splitter 5 is arranged in a beam path 4 containing the pump light. FIG. 2 shows a schematic cross-sectional view of said beam splitter and its functionality. The beam splitter 5 is made up of a transparent base body 6 as a carrier and is provided with a wavelength-dependent reflection layer 7 (a dielectric multilayer system) thereon. The base body 6 is presently merely implied, and in particular its (actually minor) effect on the beam propagation is also not considered.

Coming from the pump light unit 2, the beam path 4 containing the pump light is incident on a light incidence surface 8 of the beam splitter 5, the base body 6 presently forming said surface. The wavelength-dependent reflection layer 7 is reflective to the blue pump light; a first portion of the pump light is reflected off it. A beam path 9 containing the reflected first pump light portion is then incident on the phosphor element 3; see FIG. 1.

The wavelength-dependent reflection layer 7 is transmissive to the yellow conversion light emitted by the phosphor element 3 in response to this excitation; a beam path 10 of the conversion light which is incident on the incidence surface 8 of the beam splitter 5 passes through the beam splitter 5, i.e., exits at a light exit surface 11 (which is presently formed by the reflection layer 7) opposite the light incidence surface 8 of the beam splitter 5.

The wavelength-dependent reflection layer 7 is not provided as continuous, but is interrupted in an interruption region 12.

Pump light which is incident on this, for example, circular region is accordingly not reflected; a second portion of the pump light passes through the beam splitter 5. A beam path 13 containing the second pump light portion is incident on a mirror 14 having a diffuse-reflective reflection layer 15 FIG. 1), downstream of the beam splitter 5. The second pump light portion is then reflected back to the beam splitter 5, wherein the beam containing the second pump light portion is simultaneously expanded (due to the diffuse reflection).

The beam path 16 reflected back is then correspondingly incident over a large region on the light exit surface 11 of the beam splitter 5. Thus, only a small portion of the pump light (again) then passes the interruption region 12 to the pump light unit 2; the majority of the light reflected back onto the light exit surface 11 is reflected as a second pump light portion at the reflection layer 7 which is reflective to the pump light. As a result, a mixture made up of the conversion light and the second pump light portion is present downstream of the beam splitter 5. The mixed light is advantageously white light.

Additional details about the lighting device 1 as claimed in FIG. 1 will initially be described below, before interruption region variants or an alternative light guidance (FIG. 5) are subsequently discussed. Each laser diode of the pump light unit emits a divergent beam, each of said beams being independently collimated via a collimation optical system 21, in particular via a lens plate (which has a number of lenses corresponding to the number of laser diodes). Downstream of the collimation optical system 21, the beam cross section is still determined entirely by the spacing of the laser diodes from each other.

A telescopic optical system 22 downstream of the collimation optical system 21 is used for beam compression, i.e., it reduces the beam cross section. It is constructed from a converging lens acting as an entrance lens 22a and a diverging lens acting as an exit lens 22b. In order to prevent the formation of a hot spot on the phosphor element 3, a diffusion disk 23 is provided downstream of the telescopic optical system 22, which slightly expands the beam 4 containing the pump light.

The first pump light portion reflected from the beam splitter 5 to the phosphor element 3 passes through a system 24 made up of converging lenses and is incident on the phosphor element 3. The conversion light thereby generated in response to the excitation is emitted by the phosphor element 3 in a Lambertian manner. The converging lenses 24 are optimized in such a way as to collect as much of the conversion light as possible (however, in principle, for example, a structure having only one single converging lens would also be conceivable).

Comparably to the phosphor element 3, a lens system 25 is also associated with the reflector 14, in order to advantageously collect the total diffusely reflected pump light. An additional converging lens 26 is then provided downstream of the beam splitter 5. This converging lens 26 focuses on an integrator rod (not shown) for light mixing.

Figure 3:
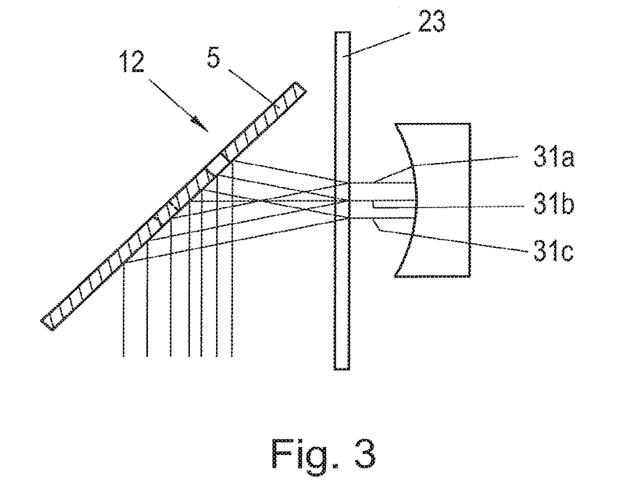
FIG. 3 shows a detailed view of a second lighting device according to the present disclosure, which is to a large extent comparable to the one according to FIG. 1.

FIG. 3 shows a detailed view of another lighting device 1, which is constructed to a large extent in a manner comparable to the lighting device 1 described based on FIGS. 1 and 2. In general, the same reference numerals refer to parts having the same function; therefore, reference is always made to the description of the respective other figures.

FIG. 3 shows a section of a lighting device 1, in particular the beam splitter 5 and the diffusion disk 23 (as well as a portion 22b of the telescopic optical system). However, unlike the lighting device according to FIG. 1, the interruption region 12 is not arranged in the center (with reference to the region of the light incidence surface 8 illuminated by the pump light), but rather is arranged offset somewhat far to the outside (an arrangement in the center is indicated by dotted lines for comparison). As a result of this non-central arrangement, the pump light contained in a first beam, in the figure, an upper beam 31a, falls primarily through the interruption region 12, whereas pump light contained in a second pump beam 31b and a third pump beam 31c is proportionately more strongly reflected. The lower beam 31c hardly contributes to the second pump light portion; the second beam 31b contributes somewhat, but considerably less than the first beam 31a.

Each of the beams 31a, b, c is emitted by one laser diode in each case (not shown). Since each of the beams is then separated in a different ratio into the first and the second pump light portion, by varying the average output power (absolutely or over a duty cycle) of the laser diodes, the ratio of the first pump light portion to the second pump light portion may be changed entirely. If, for example, the output power of the laser diode emitting the first beam 31a is increased, the ratio of the first pump light portion to the second pump light portion becomes greater, i.e., proportionately more pump light passes through the interruption region 12.

On the other hand, for example, by increasing the output power of the laser diode providing the third beam 31c, the proportion of the reflected light, and thus the proportion of conversion light (of the mixed light), may be increased. Thus, the ratio of conversion light to the second pump light portion may be changed, and is adjustable according to the color locus of the white mixed light.

Figure 4:
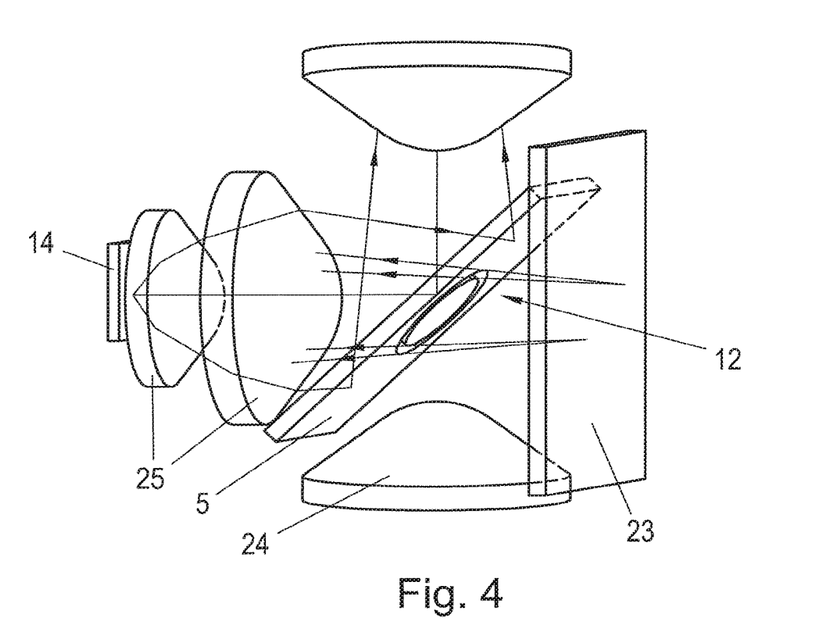
FIG. 4 shows a detailed view of a third lighting device according to the present disclosure, which also largely corresponds to the one according to FIG. 1.

FIG. 4 also shows a section of a lighting device 1, in which the wavelength-dependent reflection layer 7 of the beam splitter 5 is interrupted in an interruption region 12. However, in contrast to the previously discussed embodiments, this interruption region is not provided as a pinhole, but rather has a circular ring shape. However, the function is the same; a portion of the pump light which has a ring-shaped profile correspondingly passes through the interruption region as a second pump light portion, is reflected, is simultaneously expanded, and is then accordingly incident over a large region on the light exit surface 11 of the beam splitter 5. However, the first pump light portion is reflected off the reflection layer 7 of the beam splitter 5 (not shown in FIG. 4) and is incident on the phosphor element 3. The conversion light thereby emitted in response to this excitation passes through the beam splitter 5 (also not shown for the sake of clarity); mixed light is present downstream of it.

Figure 5:
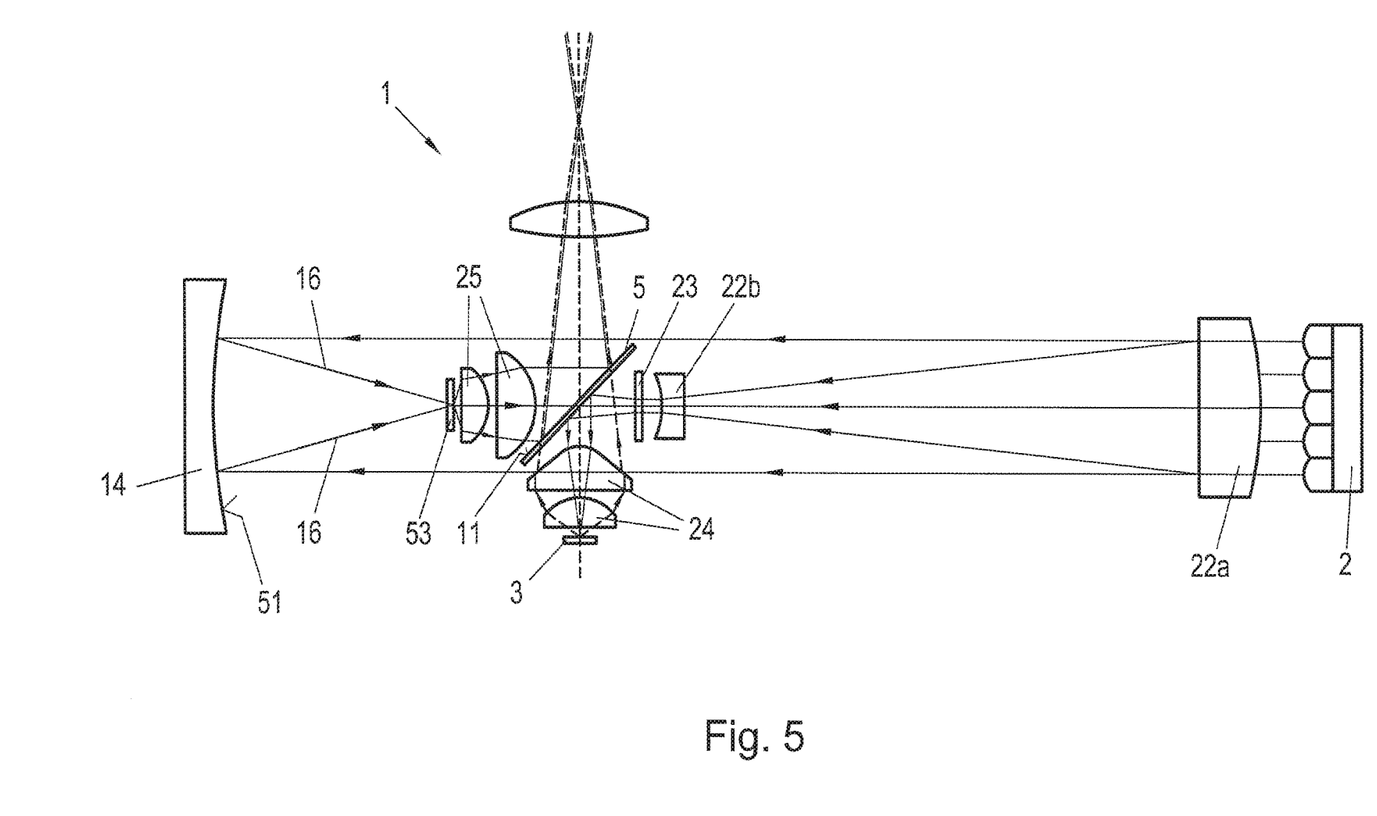
FIG. 5 shows a fourth lighting device according to the present disclosure, in which a second pump light portion, in contrast to the lighting devices according to FIGS. 1 to 4, are not directed through an interruption region, but are directed past the beam splitter.

FIG. 5 shows another lighting device 1 according to the present disclosure, in which, however, the second pump light portion, unlike the previously discussed embodiments, does not pass through the beam splitter 5 in an interruption region, but is rather directed past the beam splitter 5. The second pump light portion is then also directed via a mirror 14 back to the beam splitter 5, the reflection surface 51 of which, however, is convex and has a paraboloidal shape. The second pump light portion is thus bundled via the reflection. The beam is expanded via a diffusion disk 53; a lens system 25 arranged in the beam path 16 containing the second pump light portion, downstream of said diffusion disk, is then used for collimation; the second pump light portion thus strikes the light exit surface 11 as a collimated beam.

Figure 6:
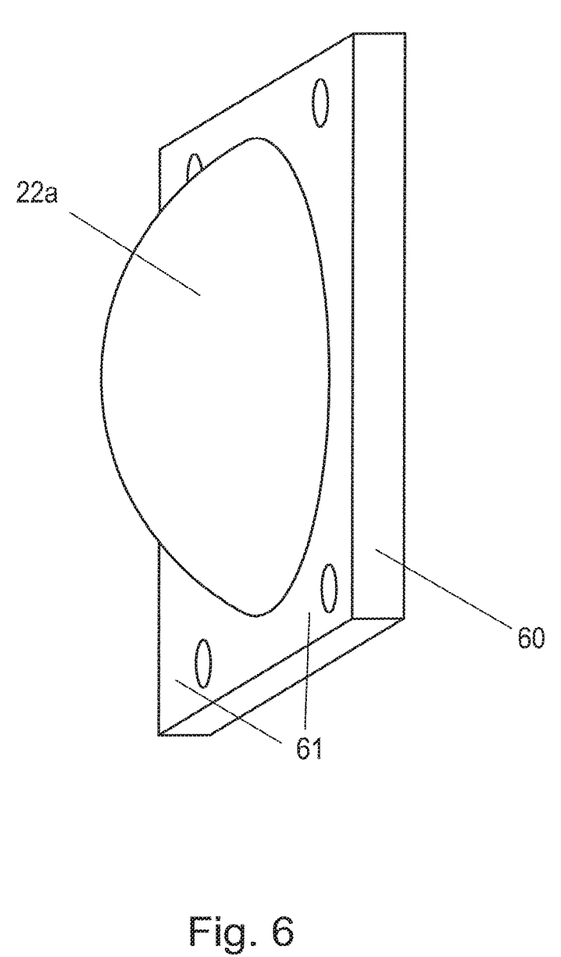
FIG. 6 shows a detailed view of the lighting device according to FIG. 5.

As in the case of the lighting device 1 described based on FIG. 1, a telescopic optical system 22 is also presently provided for beam compression, the entrance lens 22a of which being shown in principle in detail in FIG. 6.

The converging lens 22a is enclosed by a plane-parallel plate 60, the thickness direction of which being parallel to the optical axis of the converging lens 22a. A first portion of the pump light emitted by the pump light unit 2 now passes through the converging lens 22a and thus the entire beam compression optical system 22, and is reflected by the beam splitter 5 onto the phosphor element 3.

However, a second portion of the pump light (which is presently emitted by the four laser diodes arranged on the corners of the array) passes through the plane-parallel plate 60 and accordingly travels past the beam compression optical system 22. In FIG. 6, four points 61 are indicated, at which the second pump light portion passes through the plane-parallel plate 60. The second pump light portion also travels past the beam splitter 5 and is bundled with the reflection off the mirror 14 in the manner described above, and is directed to the light exit surface 11 of the beam splitter 5. Upstream of the light exit surface, the beam is expanded at the diffusion disk 53.

A mixture made up of the conversion light, which the phosphor element emits in response to the excitation by the first pump light portion (which passes through the telescopic optical system 22), and the second pump light portion, is in turn then present downstream of the beam splitter 5.

While the disclosed embodiments have been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

The invention claimed is:

1. A lighting device having
a pump light unit for the emission of pump light,
a phosphor element for the generation of conversion light in response to excitation by the pump light,
and a wavelength-dependent beam splitter which is reflective to the pump light and transmissive to the conversion light,
wherein a first portion of the pump light is incident on a light incidence surface of the beam splitter and is reflected from the beam splitter to the phosphor element,
the phosphor element emitting the conversion light in response to the excitation by the pump light,
the conversion light being incident on the light incidence surface of the beam splitter, but being transmitted by the beam splitter and exiting at a light exit surface of the beam splitter opposite the light incidence surface,
and wherein at the same point in time, a second portion of the pump light is directed onto the light exit surface of the beam splitter and is reflected from the beam splitter and is superposed with the conversion light transmitted from the beam splitter, so that downstream of the beam splitter, mixed light made up of the pump light and the conversion light is available for lighting purposes
a reflector arranged in a beam path containing the second portion of the pump light, upstream of the light exit surface of the wavelength-dependent beam splitter, and from which the second pump light portion is reflected to the wavelength-dependent beam splitter; wherein the reflector comprises a convex reflection surface from which the second portion of the pump light is bundled onto the light exit surface of the wavelength-dependent beam splitter.

2. The lighting device as claimed in claim 1, in which, directly downstream of the beam splitter, the second pump light portion has a primary direction of propagation and the conversion light has a primary direction of propagation, the primary directions of propagation being at an angle of not more than 10° with respect to one another.

3. The lighting device as claimed in claim 1, in which the beam splitter has a wavelength-dependent reflection layer which is interrupted in an interruption region, through which the second pump light portion passes and thus travels past the reflection layer and thereby passes through the beam splitter in a reflection-free manner.

4. The lighting device as claimed in claim 3, in which the interruption region is provided in the reflection layer as a pinhole or having a ring shape.

5. The lighting device as claimed in claim 3, in which a region of the reflection layer contributing to the light guidance has a reflection layer surface content taken in the layer directions of the reflection layer, and the interruption region has an interruption region surface content taken in the same directions, wherein the interruption region surface content is at a ratio of at most 1/5 with respect to the reflection layer surface content.

6. The lighting device as claimed in claim 5, in which the pump light unit is constructed from a plurality of pump light sources, wherein at least two of the pump light sources differ in their respective contribution to the first and the second pump light portion, and the at least two pump light sources are controllable independently of one another in such a way that the ratio of the first pump light portion to the second pump light portion is at least partially adjustable.

7. The lighting device as claimed in claim 6, in which the mixed light is white light, the color temperature of which is adjustable via the ratio of the first pump light portion to the second pump light portion.

8. The lighting device as claimed in claim 3, in which a scattering means is arranged in a beam path of the second pump light portion with reference to the propagation path of the second pump light portion.

9. The lighting device as claimed in claim 8, in which a diffuse reflector is provided as the scattering means and simultaneously as the reflector.

10. The lighting device as claimed in claim 3, in which an inner second pump light portion is directed through the interruption region and an outer second pump light portion travels laterally past the reflection layer, in which the second pump light portion travels laterally past a wavelength-dependent reflection layer of the beam splitter.

11. The lighting device as claimed in claim 3, in which an inner second pump light portion is directed through the interruption region and an outer second pump light portion travels laterally past the reflection layer, and in which the reflector, which is upstream of the light exit surface of the beam splitter in a beam path containing the second pump light portion, has a convex reflection surface from which the second pump light portion is bundled onto the light exit surface of the beam splitter.

12. The lighting device as claimed in claim 3, in which an inner second pump light portion is directed through the interruption region and an outer second pump light portion travels laterally past the reflection layer, and in which, downstream of the pump light unit and upstream of the light incidence surface of the beam splitter, a beam compression optical system is arranged in a beam path containing the first pump light portion past which the second pump light portion travels.

13. The lighting device as claimed in claim 3, in which an inner second pump light portion is directed through the interruption region and an outer second pump light portion travels laterally past the reflection layer, and in which a converging lens is arranged in a beam path containing the first pump light portion, downstream of the pump light unit and upstream of the light incidence surface of the beam splitter, the converging lens being enclosed by a plane-parallel plate, wherein the first pump light portion passes through the converging lens, and the second pump light portion passes through the plane-parallel plate.

14. The lighting device as claimed in claim 3, in which a diffuse scattering means is arranged in a beam path of the second pump light portion with reference to the propagation path of the second pump light portion.

15. The lighting device as claimed in claim 1, in which the second pump light portion travels laterally past a wavelength-dependent reflection layer of the beam splitter.

16. The lighting device as claimed in claim 15, in which, downstream of the pump light unit and upstream of the light incidence surface of the beam splitter, a beam compression optical system is arranged in a beam path containing the first pump light portion past which the second pump light portion travels.

17. The lighting device as claimed in claim 15, in which, downstream of the pump light unit and upstream of the light incidence surface of the beam splitter, a telescopic optical system is arranged in a beam path containing the first pump light portion past which the second pump light portion travels.

18. The lighting device as claimed in claim 1, in which a converging lens is arranged in a beam path containing the first pump light portion, downstream of the pump light unit and upstream of the light incidence surface of the beam splitter, the converging lens being enclosed by a plane-parallel plate, wherein the first pump light portion passes through the converging lens, and the second pump light portion passes through the plane-parallel plate.

* * * * *